United States Patent [19]

Coutures

[11] Patent Number: 4,831,621
[45] Date of Patent: May 16, 1989

[54] DEVICE FOR ANALOG MULTIPLEXING BY CHARGE TRANSFER DEVICES

[75] Inventor: Jean-Louis Coutures, Saint Egreve, France

[73] Assignee: Thomson-CSF, Paris, France

[21] Appl. No.: 130,398

[22] Filed: Dec. 9, 1987

[30] Foreign Application Priority Data

Dec. 19, 1986 [FR] France ................. 86 17882

[51] Int. Cl.[4] ............ H04J 3/04; H03K 23/46; H03K 17/56
[52] U.S. Cl. ................. 370/114; 377/57; 307/243
[58] Field of Search .............. 370/112, 113, 114; 307/243, 241; 377/57

[56] References Cited

U.S. PATENT DOCUMENTS

3,947,698 3/1976 Cheek, Jr. et al. ............. 377/57
4,025,801 5/1977 Gosney ................. 307/243
4,648,072 3/1987 Hayes et al. ............. 377/57

Primary Examiner—Benedict V. Safourek
Assistant Examiner—Wellington Chin
Attorney, Agent, or Firm—Roland Plottel

[57] ABSTRACT

An analog multiplexing device using charge transfer devices has as many charge transfer multiplexing registers R'i as there are input signals, at the frequency $F_e$, to be multiplexed, all of these registers preferably having the same length, and a single output register, the first stage of which is connected by a connection to the respective stages with levels i of the registers R'i, i=1 to n, enabling the reading by image charges of the input charges. The transfer into the successive stages of the multiplexing registers is done at a frequency $nF_e$ just as the transfer of the image charges read by the read connection in the output register stages.

7 Claims, 6 Drawing Sheets

FIG_1 PRIOR ART

FIG_2 PRIOR ART

FIG_5

FIG_6a

FIG_6b

FIG_6c

FIG_7

FIG_8

DEVICE FOR ANALOG MULTIPLEXING BY CHARGE TRANSFER DEVICES

BACKGROUND OF THE INVENTION

1. Field of the Invention

The invention pertains to the processing of signals coming from the matrix structures of light-sensitive detectors, especially infrared sensors and, more especially, to a device that uses charge transfer devices for the analog multiplexing of signals from detectors of this type.

2. Description of the Prior Art

Several prior art methods use charge transfer registers to multiplex samples of analog signals. In one such method, samples of analog signals from several inputs (n inputs) are transferred in parallel to the various stages of an output charge transfer register and are read serially at the analog output of this output register. The transfer frequency of the output register is n times the frequency of the input samples.

In another method, the samples coming from n input registers are introduced into an output register by successive commands, distributed over one cycle of the input signal, from n analog gates connecting the outputs of these registers to the input of the output register.

In the two multiplexing modes briefly described above, the transfer of analog samples between the input registers and the output register is done by transferring analog charges. These methods require a juxtaposition between the input register outputs and the input or inputs of the output register. Consequently, the size of the output register, namely its length when the inputs are in parallel at the stages of an output register, or its width when the inputs are connected to the input of the output register through analog gates, is made necessary by the repetition pitch of the input registers. Now, these dimensions which are made necessary may be incompatible with the geometry required for efficient transfer in the output register, or they may be excessive with respect to the charge to be transferred, the result of this being an unnecessary increase of unwanted dark current in the output charge transfer register.

Furthermore, these two modes of multiplexing require control signals:

A single control signal for the first transfer mode: this does not constitute much of a constraint;

As many control signals as there are gates in the second method, resulting in a more complicated and, therefore, less reliable system.

SUMMARY OF THE INVENTION

An object of the present invention is a device to multiplex n sampled analog signals, coming from n charge transfer input registers and being simultaneously present in these registers, towards an output charge transfer register which removes the disadvantages of the devices described above through a structure eliminating all multiplexing gate commands, does not necessitate any particular juxtaposition of the n input registers and of the output register comprising the multiplexed charges, and makes it possible to build a multiplexer of signals with high values in relating to the storage possibilities of input charge transfer registers.

The invention pertains to an analog multiplexing device that uses charge transfer devices to multiplex n analog signals, sampled at the frequency Fe, from the output stages of n input charge transfer registers, at which these signals are present simultaneously, towards an output charge transfer register, a device wherein the n charge transfer multiplexing registers respectively have 1, 2, ... n stages and receive the charges that come simultaneously from the input registers, the transfer being done at the frequency $nF_e$ in these registers, the outputs of these multiplexing registers being connected to the first stage of the output register.

BRIEF DESCRIPTION OF THE DRAWINGS

The invention will be better understood and its other characteristics will emerge from the following description made with reference to the appended figures, of which.

DESCRIPTION OF PREFERRED EMBODIMENTS

Figure 1:
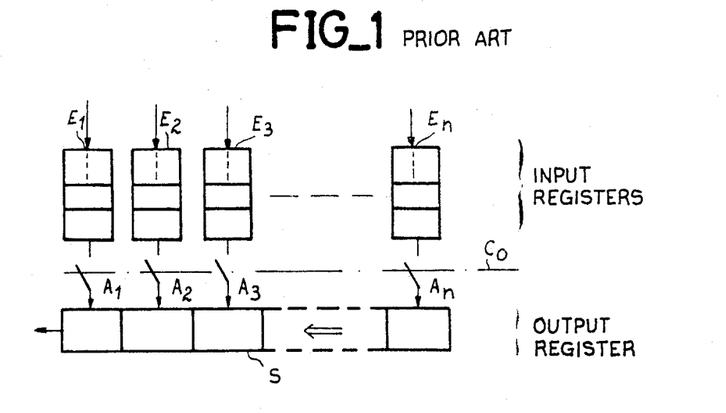
FIG. 1 is a schematic view of a first analog multiplexing device of the prior art.

FIG. 1, which represents a conventional multiplexing device, shows n input registers $E_1, E_2 \ldots E_n$, connected by gates $A_1, A_2 \ldots A_n$ respectively, to the n parallel inputs of the n stages of an output charge transfer register S. In this prior art embodiment, a single gate command signal $C_0$ is used for the simultaneous transfer of the charges contained in the last stages of the input registers $E_1 \ldots E_n$ respectively to the n stages of the output register. If $F_e$ is the frequency of the samples in the input registers $E_1 \ldots E_n$, the charge transfer output register should be read at the frequency $nF_e$ for the serial output of the multiplexed samples, the samples present at the analog output of the register S being at the frequency $nF_e$. As indicated above, the disadvantage of this device is that it requires the output register to have a length equal to n times the repetition pitch p of the input registers. Furthermore, this device requires a gate control signal.

Figure 2:
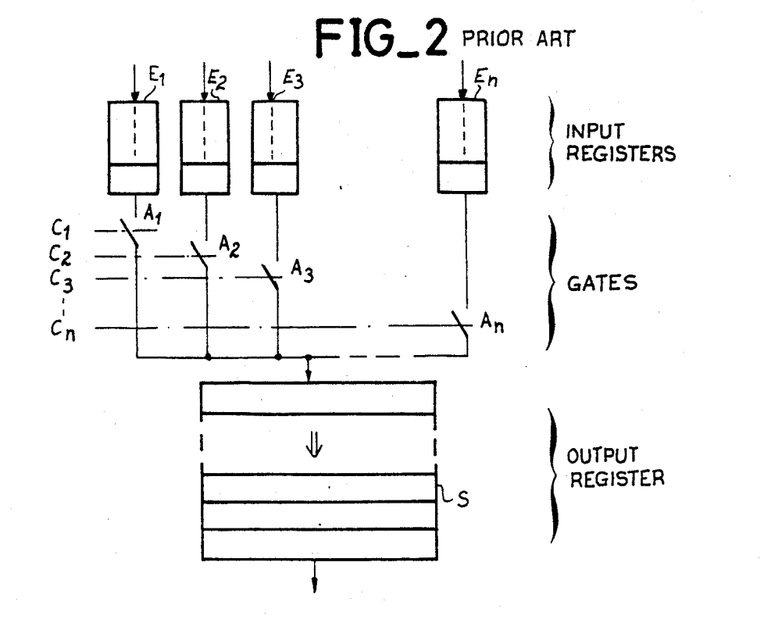
FIG. 2 is a schematic view of a second multiplexing device of the prior art.

FIG. 2 shows a second multiplexing device of the prior art, already described briefly above. This device has n input registers $E_1, E_2, \ldots, E_n$, the output stages of which are all coupled to the series input of an output register S, each by means of a gate, $A_1, A_2 \ldots, A_n$, respectively, each of these gates receiving a shifted signal $C_1, C_2, \ldots, C_n$ respectively. Since $F_e$ is the frequency of the samples at input, each command signals is shifted with respect to the following ones by $1/nF_e$. Thus the content of the output stages of the input registers is successively transferred to the same input stage of the output register S, the charges being transferred into the output register at the frequency $nF_e$. As indicated briefly above, the disadvantage of this multiplexing device is, firstly, that it requires several time-shifted command signals and, secondly, that the geometrical width of the output register is a multiple of the repetition pitch of the input register and is, therefore, often too big in relation to the quantity of charges to be transferred into it.

Figure 3:
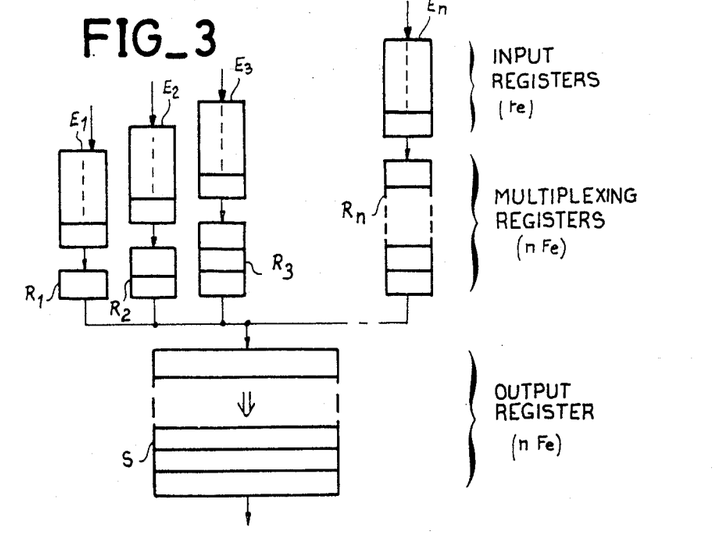
FIG. 3 shows a first embodiment of the analog signals multiplexing device according to the invention.

In the first embodiment of the multiplexing device according to the invention, shown in FIG. 3, the charges are transferred from the output stages of the input registers $E_1, E_2, \ldots E_4$ not directly to the output register S but through intermediate multiplexing registers $R_1, R_2 \ldots R_n$, each connected to the output of an input register, the outputs of the multiplexing registers being directly coupled to the series input of the output register S. The charges present in the last stages of the input registers $Q_1, Q_2 \ldots Q_n$ are transferred simultaneously into the multiplexing registers $R_1, R_2 \ldots R_n$. The intermediate registers introduce delays which are respectively equal to zero, $1/nF_{Fe}$, $2/nF_e$, ... $1/nF_e$. The charge $Q_1$ is then immediately available at the output of $R_1$ for transfer into the output register S, the charge $Q_2$ is available at the output of the register $R_2$ with a delay of $1/nF_e$, the charge $Q_3$ is available at the output of the register $R_3$ with a delay charge $Q_n$ is available at the output of the register $R_n$ with a delay of $1/(F_e)$. Thus, the multiplexing is done by the transfer into the output register S with delays determined by the lengths of the registers $R_1, R_2, \ldots R_n$.

This method eliminates the gate command signals described above. Nevertheless the vertical shift of the input stages of the registers $E_1 \ldots E_n$, made necessary by this structure so that the outputs stages of the multiplexing registers are adjacent to each other, leads to problems at the designing stage. For the repetitions of patterns intended to form the electrodes are not done along orthogonal axes because the multiplexing registers do not have identical lengths. Furthermore, since it has to be possible for the transfer to take place from all the output stages of the multiplexing registers to the input stage of the output register, the width of the latter register is greater than would be warranted by the quantity of charges to be transferred at each clock pitch with a frequency of $1/nF_e$.

Figure 4:
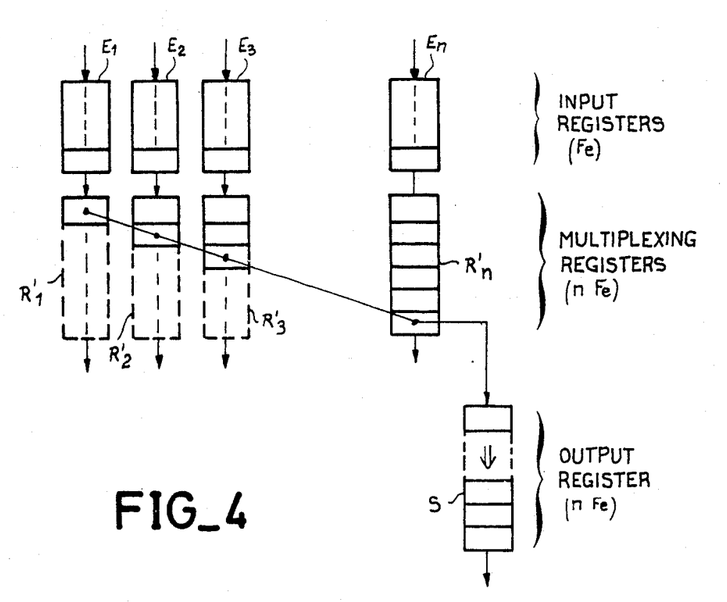
FIG. 4 shows a second embodiment of the multiplexing device according to the invention.

FIG. 4 shows a second preferred embodiment of the invention using analog transfers, but preserving the structure in which the patterns are repeated when making the arrays of electrodes. This embodiment also makes it possible to match the dimensions of the output register precisely with the output multiplexed signal. For this, the analog samples transferred into the output register S are not the charges forming the input signals, or the "signal" charges themselves, that are transferred into the intermediate multiplexing registers, but their images or recreated equivalent charges recreated by so-called on-gate reading of the "signal" charges. These "signal" charges themselves can then be removed through multiplexing register outputs which are all identical.

The structure is then as follows: the input parallel registers $E_1, E_2 \ldots E_n$, are connected to the input stages of identical intermediate multiplexing registers $R'_1, R'_2 \ldots R'_n$, all having n stages. The charges present in the input registers are removed through the outputs of these different registers. For the multiplexing a read connection, joining together a read gate of the first stage of the register $R'_1$, a read gate of the second stage of the register $R'_2$ etc. and a read gate of the nth stage of the register $R'_n$, is connected to the input of the output register S. This read connection makes it possible, when the "source" charges go under the stage connected to the read bus at time intervals of $1/nF_e$, to create the image charges or recreated equivalent charges in the input stage of the output register. These charges $Q'_1, Q'_2 \ldots Q'_n$, which are images of source charges present in the multiplexing registers $R'_1, R'_2 \ldots R'_n$ and which result from the read operation, are transferred into the output register with a d.c. component $Q_0$, which may be positive, negative or zero depending on the setting of an external polarization. In FIG. 4, the stages that are useful for multiplexing in the various multiplexing registers $R'_1, R'_2 \ldots R'_n$ are marked with unbroken lines while those not used for the multiplexing and those used solely for the continuity of the transfer gates, as part of a repetition of the multiplexing system, are shown with dashes. The charges coming from the various intermediate registers of the multiplexing operation can be removed by a common drain.

Figure 5:
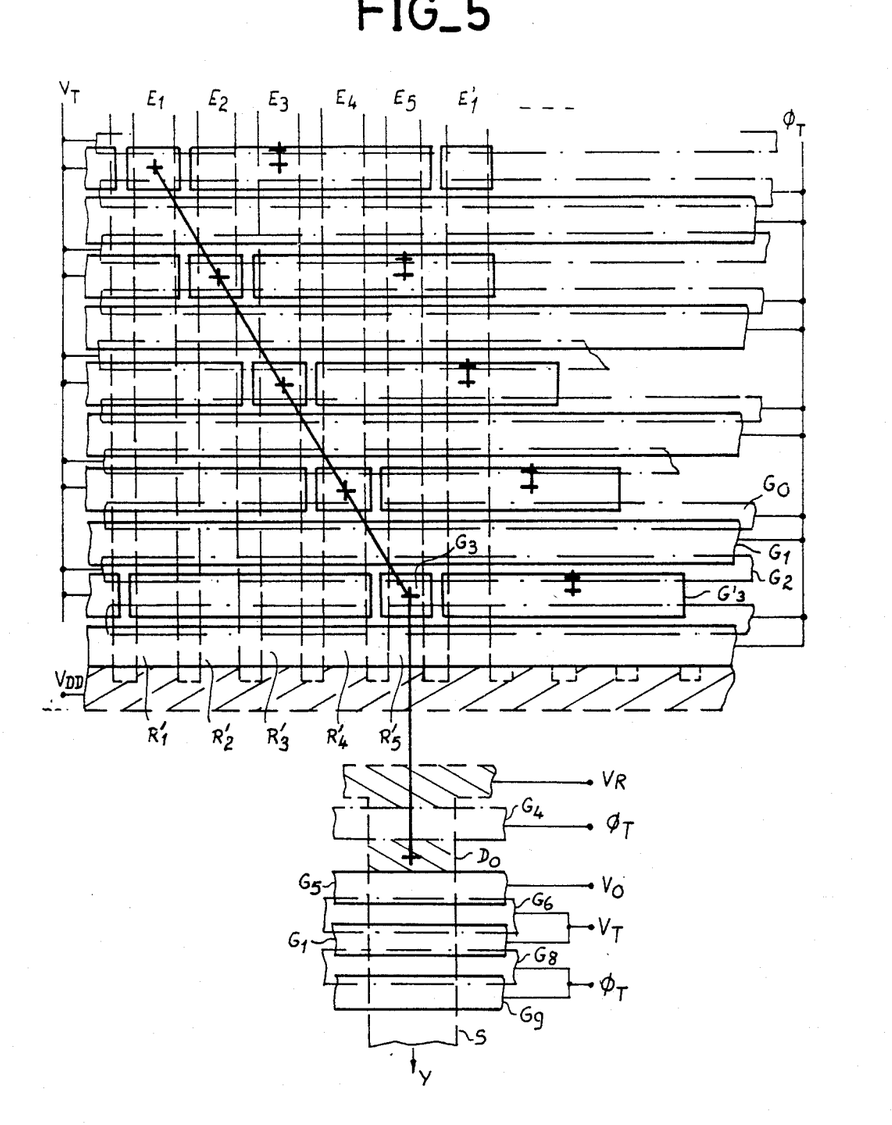
FIG. 5 is a detailed partial diagram of a multiplexing device according to the invention, which can be applied to a matrix structure in which groups of signals coming from five successive inputs are transferred to a common output.

FIG. 5 is a detailed partial diagram of a multiplexing unit according to the invention, comprising a series of inputs grouped in sets of five. The signals transmitted by the five input registers $E_1, E_2 \ldots E_5$, (not shown) are multiplexed at an output charge transfer register S by intermediate multiplexing registers made as follows: the multiplexing registers $R'_1, R'_2 \ldots R'_5$ are demarcated by the vertical dashes on FIG. 5, marking the separation between registers. Similarly, the output charge transfer register S is demarcated in the same way by a separation shown in dashes. In the substrate, at a first level, two interposed parallel electrode arrays, $G_1$ and $G'_3$, are made. They are shown in unbroken lines. These arrays are orthogonal to the direction of transfer in the charge transfer registers. A masking is done to separate the read gates $G_3$ in the array $G'_3$ at the stages $1, 2, \ldots n$, of the intermediate register. At the same time as these two arrays designed to form the intermediate charge transfer registers are made, the gates of the first level of the output register S are also made. These are $G_5, G_7, G_9$ in FIG. 5 where only the first stage of the output transfer register is shown.

At a second level of the circuit, a second series of electrodes is made. These electrodes are shifted with respect to the first level electrodes and also forming two parallel, interposed arrays, $G_0$ and $G_2$. At the same time as these two parallel arrays an electrode $G_4$ and interposed arrays of electrodes, $G_6$ and $G_8$, of the output S register are formed at the second level of the circuits. These arrays are shifted and partially cover the electrodes $G_5$ and $G_7$ on the one hand and $G_9$ on the other hand. Two diffusion zones are also made for the formation of image charges on either side of the gate $G_4$. One diffusion zone $D_0$ is between the two electrodes $G_4$ and $G_5$ and the other diffusion zone is on the other side of the gate $G_4$, which is carried to a potential $V_R$. The arrays of electrodes $G_0$ and $G_1$ are polarized by a command signal $\phi_T$ with two levels, a high level $V_1$ and a low level $V_2$, while the array of electrodes $G'_3$ is connected to a transfer voltage $V_T$, through connection with the subjacent array $G_2$ which is also carried to this potential.

In the output register, the gate $G_5$ is polarized by a direct voltage $V_0$, $G_6$ and $G_7$ are polarized by the voltage $V_T$ and $G_8$ and $G_9$ receive the command signal $\phi_T$.

At the read gates $G_3$, contacts are provided as well as an oblique connection made of aluminium which connects these various elements of the gate $G_3$. The element of the gate $G_3$ of the fifth stage of the shift register $R_5$ is connected by means of an Al-Gate contact, a connection and an Al-Diode contact to the diffusion zone $D_0$. Finally, the shift registers $R'_1$, $R'_2$ ... $R'_5$ all end in a common drain at the potential $V_{DD}$ which enables the removal of the charges transferred into these registers.

The reading of the intermediate registers is a method for reading in current, described in the French patent applications Nos 78 19933 and 81 18135 filed on behalf of the applicant. This is a method in which an alternative is used: the current is not converted into voltage by a capacitor, but is preserved in the form of charges in a potential well at a charge transfer stage of the output register.

Figure 6A:
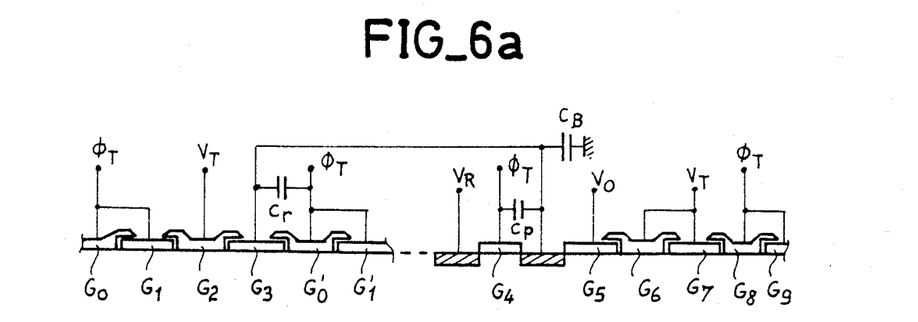
FIGS. 6a, 6b and 6c respectively show sectional views of the various electrodes of the structure according to FIG. 5 and the corresponding potential graphs depending on the state of the command signal.
Figure 6B:
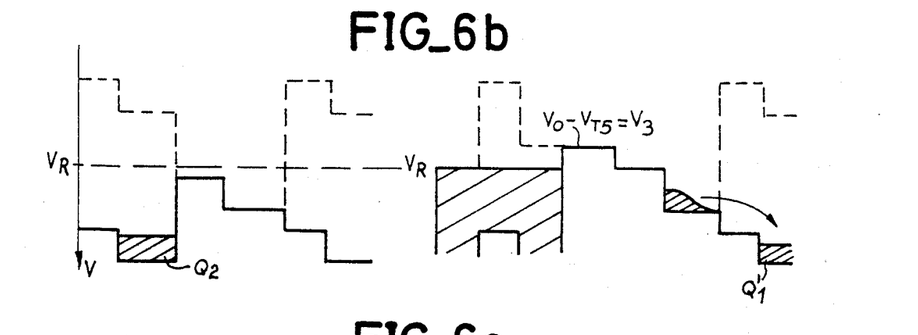
Figure 6C:
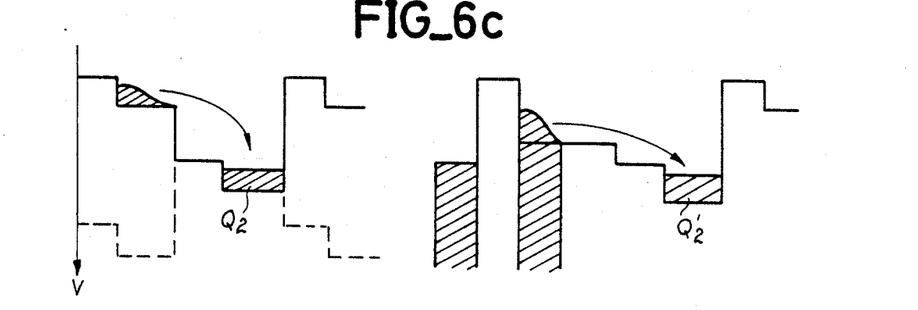

FIGS. 6a, 6b and 6c respectively show sectional views along Y of the structure of FIG. 5 and the associated channel potential graphs when the command signal $O_T$ is at the high level V (FIG. 6b) and at the low level $V_2$ (FIG. 6c) respectively. The same references as in FIG. 5 have been used to designate the various gates of the structure, $G_0$ and $G'_0$ being two electrodes of the array $G_0$, $G_1$ and $G'_1$ being two electrodes of the array $G_1$. These figures illustrate the read method used in this embodiment of the multiplexing device. At the left-hand side of the figure, there are the various gates shown along with the associated channel potentials, forming the read stage of an intermediate register, and at the right-hand side of these figures, there are the various gates, constituting the zone where the image charges are formed and the first stage of the output register, and the associated channel potential.

The charge transfer registers have a single-phase command transfer, i.e. the transfer control signal $\phi_T$ takes successively, as indicated above, a high state $V_1$ and a low state $V_2$. This signal is applied to the pair of gates $G_0$, $G_1$, of the multiplexing registers; a direct voltage $V_T$ equal to $(V_1-V_2)/2$ is applied to the gate $G_2$. As indicated above, the stage to be read comprises successive gates in the direction of transfer, $G_0$, $G_1$, $G_2$ and $G_3$. An implantation to create disymmetry in the potentials is made in the silicon substrate under the gates $G_0$ amd $G_2$.

In the read sequence, there are two stable states: FIG. 6b represents the first stable state when the command signal $\phi_T$ is at the high state.

In this case, at the intermediate register side, the charge Q is stored under the gate $G_1$, giving $Q=Q_2$ if it is the second stage of the intermediate register $R'_2$ which is read.

The potential of the gate $G_3$ is the potential $V_R$, this gate $G_3$ being carried to this potential by means of the read connection which connects the gate $G_3$ to the diffusion zone $D_0$ which is then at the potential $V_R$ since $O_t$ is at the high state $V_1$:

For the other part of the figure; in the diffusion zone and the first stage of the output register, the direct voltage $V_0$ applied at $G_5$ causes the channel potential under $G_5$ to be equal to $V_0-V_{T5}D$. $V_0$ is chosen so that $V_0-V_{T5}$ is equal to $(V_1-V_2)/2$, $V_{T5}$ being the conduction threshold under the gate $G_5$. The image charges corresponding to the source charges read in the preceding intermediate register, namely $Q'_1$, and stored under $G_7$ in the preceding stage where $0_D$ was at the low state, are then transferred under $G_9$ which is then at the high $\phi_T$ potential: $V_1$.

When the transfer command signal $\phi_T$ goes to the low state, the FIG. 6c shows at its left-hand side that the charge $Q_2$, initially under $G_1$, is transferred under the gate $G_3$ because the potential applied to $G_1$ decreases to $V_2$ while the potential under $G_3$ decreases. The potential of the read connection becomes floating through a break in the conduction of the channel under $G_4$, and therefore that of $G_3$. The said potential is set at the channel potential under the gate $G_5$ of the output register S, namely at the potential $(V_1-V_2)/2$.

An image charge $Q'_2$ can then be transferred from the diode $D_0$ to the potential well under $G_7$ of the output register and then under $G_9$ during the following change of $\phi_T$ to the high state (as indicated above). This image charge $Q'_2$ is such that:

$$Q'_2 = Q_2 + (C_p + C_r)\phi - |V_R - (V_O - V_O - V_{T5})| \times C_B$$

where $\phi = V_1 - V_2$, $C_p$ and $C_r$ are coupling capacitances successively between $G_4$ and the read bus and $G'_0$ and between the read bus and $C'_0$, while $C_B$ is the capacitance of the read bus, namely $Q'_2 = Q_2 + Q_0$.

It is seen that, depending on the voltage $V_R$, the charge $Q_0$ can be positive, negative or zero, and therefore that the d.c. component can be set.

$-Q_0=0$ with $V_R$ is equal to
$(C_P+C_r)\phi/C_B+(V_0-V_{T5})=V$ $Q_0$ positive with $V_R$ smaller than V; in this case, a basic additional charge $Q_0$ is added to the charge $Q_2$ to form the image charge $Q'_2$;

$Q_0$ negative with $V_R$ greater than V; in this case the initial charge signal $Q_2$ is cut at the bottom to form the signal generated in the output register.

Figure 7:
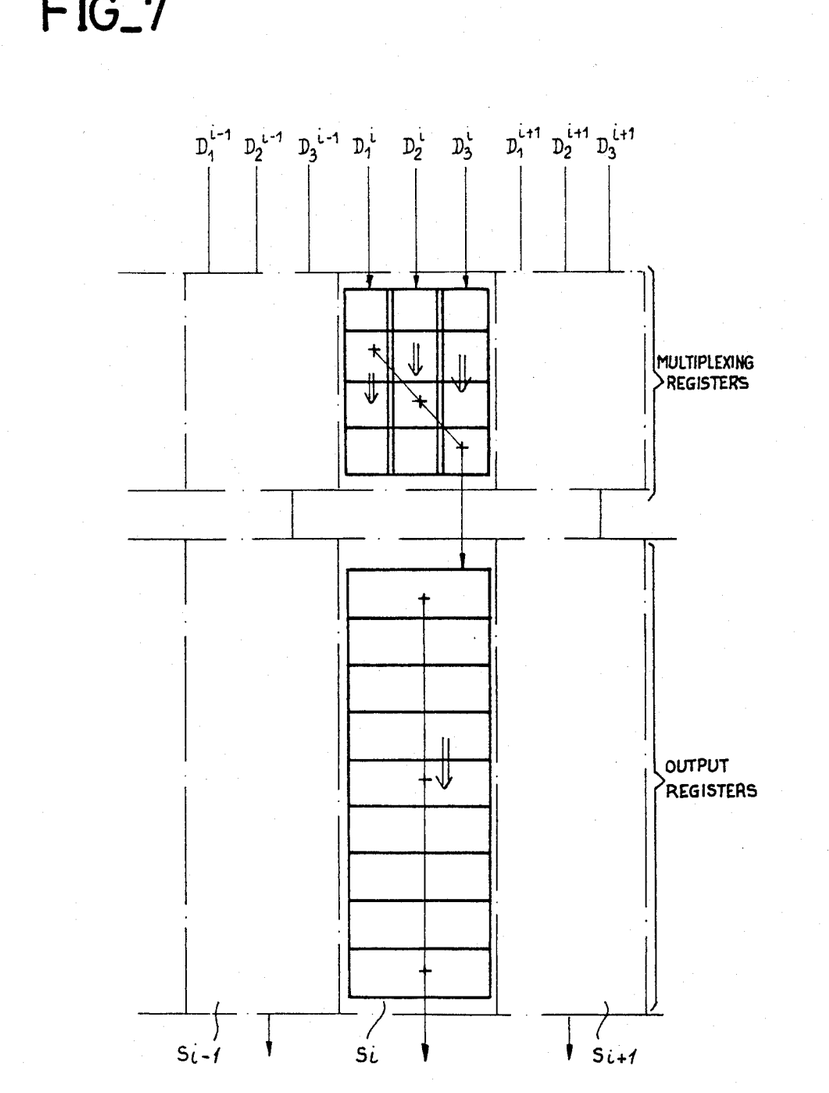
FIG. 7 is a diagram of an embodiment of the invention in which the output register performs an adding operation with a delay.

The multiplexing device of the invention is especially applicable to reading in the "focal plane" (i.e. in the plane where the image is formed) of signals coming from a matrix structure of light-sensitive sensors as can be seen in FIG. 7.

The signals coming from n photodiodes $D_1^i$, $D_2^i$, $D_3^i$, with n=3, of one and the same column i of the matrix, are multiplexed towards an output register $S_i$ which performs an addition with a delay in the signals coming from these n photodiodes. This addition is done according to the processing method known as TDI (time delay integration) described especially in the French patent application No. 85 01972 filed on behalf of the applicant. This processing should be done simultaneously for all the columns ... i−1, i, i+1 ... of the matrix, thus making necessary a parallel TDI processing structure in the output registers ... $S_{i-1}$, $S_i$, $S_{i+1}$ at the pitch made necessary by the photodiodes as defined in FIG. 7 in an example of three-to-one way channel multiplexing.

The load which can be stored in the multiplexing registers depends on the geometry of the charge transfer stage and, more especially, on the width of the charge transfer registers (the length is restricted essentially by the transfer frequency). In one application where the repetition pitch for TDI processing takes a relatively large number of photodiodes per column into account, the multiplexing registers have little width.

Figure 8:
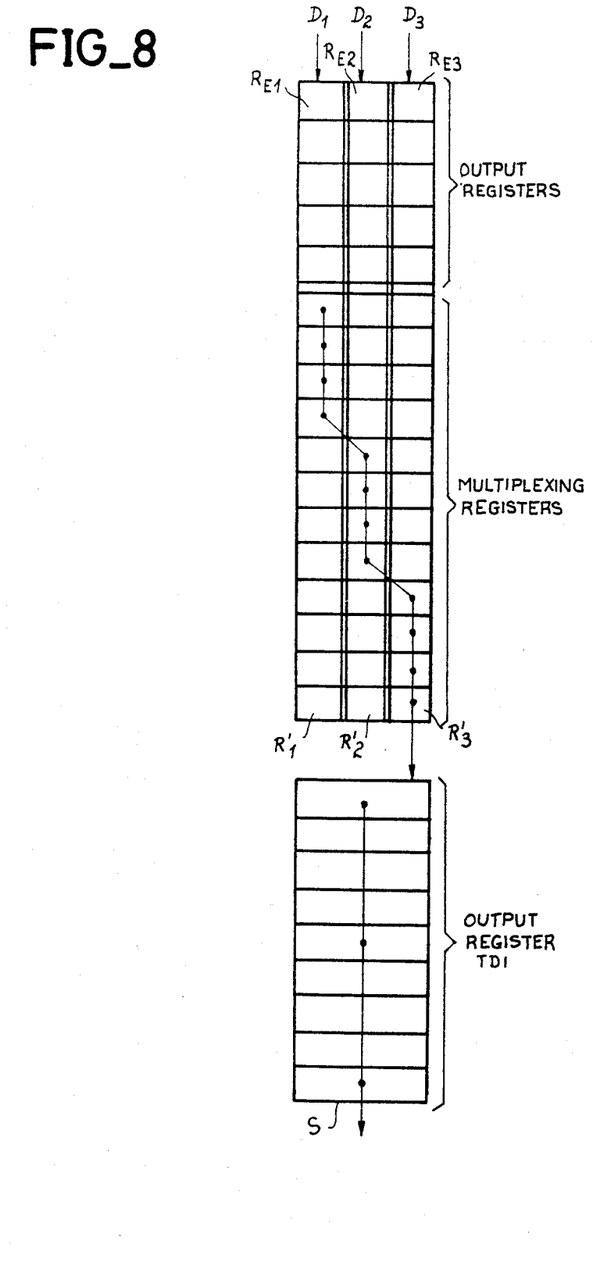
FIG. 8 is a diagram showing a distribution of charges that come from the input registers for multiplexing.

For a high-value signal in charge coming from photodiodes, one method of transferring these charges correctly is to divide each elementary signal into m "packets" of charges distributed among m input charge transfer register stages, and then to transfer these packets towards the multiplexing registers at the frequency nmF$_e$. FIG. 8 shows a diagram of the distribution of charges constituting a signal, D$_1$, D$_2$ and D$_3$ respectively, among m=4 input charge transfer register stages R$_{E1}$, R$_{E2}$, R$_{E3}$, then of three-to-one channel multiplexing through three multiplexing registers, R'$_1$, R'$_2$ and R'$_3$, each having n.m=12 stages. For this, the read connection connects the first four stages of the register R'$_1$, the middle four middle of the register R'$_2$ and the last four stages of the register R'$_3$ to the first stage of the integration output register S. The reconstitution of the initial signal is then done by a simultaneous reading of the m packets of charges coming from the same photodiode. These charges are presented simultaneously at m stages, the gates of which are connected by the read connection. The transfer of the input divider registers and of the multiplexing registers is done at the frequency n.F$_e$, if F$_e$ is the read frequency of the photodiodes.

What is claimed is:

1. An analog multiplexing device using charge transfer devices, for the multiplexing of n analog signals sampled at the frequency F$_e$, coming from the output stages of n input charge transfer registers, where said signals from said output stages are present simultaneously, towards an output charge transfer register, wherein n charge transfer multiplexing registers, having respectively 1, 2, ..., n stages, receive the charges that come simultaneously from the input charge transfer registers, the transfer being done at the frequence nF$_e$ in said charge transfer multiplexing the outputs of said multiplexing registers being connected to a first stage of the output register.

2. An analog multiplexing device using charge transfer devices for the multiplexing of n analog signals, sampled at the frequence F$_e$, coming from the output stages of n input charge transfer devices, where said signals from said output stages are present simultaneously, wherein n charge transfer multiplexing registers receive, at their input stages, the charges coming simultaneously from the input charge transfer devices, and transfer them to stages at the frequency nF$_e$, and wherein a connection respectively connects the stage levels i, where i=1 to n, of the n charge transfer registers of the multiplexing registers, to the first stage of an output register, image charges of the charges contained in these respective stages at instants time-shifted by 1/nF$_e$ being created in the output register where they are shifted at the frequency nF$_e$.

3. A device according to the claim 2 wherein the n charge transfer multiplexing registers all have n stages and, therefore, the same length, the charges being transferred into the n stages of said charge transfer multiplexing registers before they are removed through a common drain connecting output stages.

4. An analog multiplexing device using charge transfer devices for the multiplexing of n high-value analog signals sampled at the frequency F$_e$, each of said signals being distributed among m packets of charges in m successive stages of input registers where the signals are present simultaneously, wherein n charge transfer multiplexing registers, each multiplexing register comprising n.m stages said multiplexing registers receiving at their input stages, the charges coming from the input registers at the frequency n.m.F$_e$ and transferring said charges to the successive stages at the same frequency, and wherein a connection links the stages of levels $|(i-1)m+1|$ to (i.m) of the multiplexing registers, for i=1 to n, to the first stage of a charge transfer output register S, image charges of the charges contained in these interconnected stages, at instants that are time-shifted by 1/n.F$_e$, being created in the input stage of the output register where they are then shifted at the frequency n.F$_e$.

5. A device according to the claim 3 wherein the output register is an adding register with a delay, which totalizes the charges transferred successively into a sequence of successive stages.

6. A device according to the claim 1 for the reading of signals coming from a matrix structure of photosensors, wherein the multiplexed analog signals are the signals coming from a sequence of n photodiodes belonging to one and the same column of the matrix.

7. A device according to the claim 6 wherein the input registers distribute the signal coming from each photodiode in a sequence of m stages of the corresponding input register.

* * * * *